United States Patent
Teng

(10) Patent No.: US 7,348,131 B2
(45) Date of Patent: *Mar. 25, 2008

(54) LASER SENSITIVE LITHOGRAPHIC PRINTING PLATE HAVING A DARKER ALUMINUM SUBSTRATE

(76) Inventor: Gary Ganghui Teng, 10 Kendall Dr., Northborough, MA (US) 01532

(*) Notice: Subject to any disclaimer, the term of this patent is extended or adjusted under 35 U.S.C. 154(b) by 0 days.

This patent is subject to a terminal disclaimer.

(21) Appl. No.: 11/175,518

(22) Filed: Jul. 5, 2005

(65) Prior Publication Data

US 2007/0009829 A1    Jan. 11, 2007

(51) Int. Cl.
G03F 7/11 (2006.01)
G03F 7/09 (2006.01)
G03F 7/14 (2006.01)
G03F 7/38 (2006.01)
G03F 7/28 (2006.01)

(52) U.S. Cl. .............. 430/302; 430/278.1; 430/281.1; 430/285.1

(58) Field of Classification Search ............. 430/270.1, 430/273.1, 278.1, 281.1, 286.1, 287.1, 288.1, 430/302, 309, 435, 494, 944, 945, 285.1
See application file for complete search history.

(56) References Cited

U.S. PATENT DOCUMENTS

| | | | |
|---|---|---|---|
| 5,368,974 A | 11/1994 | Walls | 430/156 |
| 5,607,816 A | 3/1997 | Fitzgerald et al. | 430/271.1 |
| 5,738,974 A * | 4/1998 | Nagasaka et al. | 430/278.1 |
| 5,910,395 A | 6/1999 | Li et al. | 430/302 |
| 6,014,929 A | 1/2000 | Teng | 101/456 |
| 6,136,503 A | 10/2000 | Zheng et al. | 430/270.1 |
| 6,153,356 A | 11/2000 | Urano et al. | 430/281.1 |
| 6,232,038 B1 | 5/2001 | Takasaki et al. | 430/281.1 |
| 6,309,792 B1 | 10/2001 | Hauck et al. | 430/270.1 |
| 6,331,375 B1 | 12/2001 | Kawamura et al. | 430/270.1 |
| 6,335,144 B1 * | 1/2002 | Murota et al. | 430/281.1 |
| 6,482,571 B1 | 11/2002 | Teng | 430/302 |
| 6,541,183 B2 * | 4/2003 | Teng | 430/303 |
| 6,558,875 B1 * | 5/2003 | Toshimitsu et al. | 430/302 |
| 6,576,401 B2 | 6/2003 | Teng | 430/303 |
| 6,689,537 B2 | 2/2004 | Urano et al. | 430/273.1 |
| 6,740,464 B2 | 5/2004 | Maemoto | 430/138 |
| 7,213,516 B1 * | 5/2007 | Teng | 101/451 |
| 2002/0018962 A1 * | 2/2002 | Urano et al. | 430/273.1 |
| 2003/0186165 A1 | 10/2003 | Gries et al. | 430/281.1 |
| 2003/0200886 A1 * | 10/2003 | Vermeersch et al. | 101/467 |
| 2004/0013968 A1 * | 1/2004 | Teng | 430/270.1 |
| 2006/0269873 A1 | 11/2006 | Knight et al. | 430/302 |
| 2007/0184380 A1 | 8/2007 | Tao et al. | 430/270.1 |

* cited by examiner

Primary Examiner—Richard L. Schilling

(57) ABSTRACT

A laser sensitive lithographic printing plate comprises an electrochemically grained, anodized, hydrophilically treated aluminum substrate with a reflection optical density of 0.30 or higher; a free radical polymerizable photosensitive layer; and a water soluble or dispersible overcoat. The photosensitive layer comprises a polymeric binder, a free radical polymerizable monomer, a free radical initiator, and a sensitizing dye. Such dark aluminum substrate in combination with the hydrophilic treatment allows both clean background and good printing durability. Such plate can be exposed with a suitable laser at lower dosage to cause hardening in the exposed areas. The exposed plate can be developed with a regular liquid developer or with ink and/or fountain solution.

17 Claims, No Drawings

LASER SENSITIVE LITHOGRAPHIC PRINTING PLATE HAVING A DARKER ALUMINUM SUBSTRATE

FIELD OF THE INVENTION

This invention relates to lithographic printing plates. More particularly, it relates to laser sensitive negative-working lithographic printing plates having a photosensitive layer over a hydrophilically treated darker aluminum substrate (with higher reflection optical density).

BACKGROUND OF THE INVENTION

Lithographic printing plates (after process) generally consist of ink-receptive areas (image areas) and ink-repelling areas (non-image areas). During printing operation, an ink is preferentially received in the image areas, not in the non-image areas, and then transferred to the surface of a material upon which the image is to be produced. Commonly the ink is transferred to an intermediate material called printing blanket, which in turn transfers the ink to the surface of the material upon which the image is to be produced.

At the present time, lithographic printing plates (processed) are generally prepared from lithographic printing plate precursors (also commonly called lithographic printing plates) comprising a substrate and a photosensitive coating deposited on the substrate, the substrate and the photosensitive coating having opposite surface properties. The photosensitive coating is usually a photosensitive material, which solubilizes or hardens upon exposure to an actinic radiation. In positive-working systems, the exposed areas become more soluble and can be developed to reveal the underneath substrate. In negative-working systems, the exposed areas become hardened and the non-exposed areas can be developed to reveal the underneath substrate.

Conventionally, the actinic radiation is from a lamp (usually an ultraviolet lamp) and the image pattern is generally determined by a photomask that is placed between the light source and the plate. With the advance of laser and computer technologies, laser sources have been increasingly used to directly expose a lithographic printing plate that is sensitized to a corresponding laser. This allows the elimination of the photomask film, reducing material, equipment and labor cost. Among the lasers used are infrared lasers (about 830 nm or 1064 nm), FD-YAG laser (about 532 nm), argon ion laser (about 480 nm), and violet laser (about 405 nm). Laser diodes (such as violet laser diode of about 405 nm, and infrared laser diode of about 830 nm) are especially useful because of their low imager cost.

Among the laser sensitive plates proposed (including silver halide plates, positive plates, and negative plates), photopolymerizable composition based (also called photopolymer) laser sensitive plate is the most desirable because of the high durability of conventional photopolymer plate and its negative-working characteristics (no coated edge on the developed plate when imaged on external drum). However, because the energy output of a laser diode is quite limited and the exposure time of laser for each area is extremely short, it is very difficult to design a laser sensitive photopolymer plate with sufficient photospeed and press durability suitable for commercial applications.

U.S. Pat. No. 6,689,537 describes a violet photopolymer lithographic printing plate where a grained and anodized aluminum with higher reflection optical density (from 0.3 to 0.5, by using no or less desmut treatment) is proposed for achieving higher photospeed and improved printing durability. The aluminum substrate is electrochemically grained and anodized, with no or less desmut treatment, and then directly coated with the photosensitive composition. While such a substrate gives higher photospeed and improved press durability, it has the tendency of background toning (inked non-imaging areas) on press, compared to typically clean background for substrate with typical optical density (such as 0.20 to 0.28, with typical desmut treatment). Hydrophilic treatment after the anodization is not used apparently because the hydrophilic treatment generally reduces the photospeed and press durability.

The inventor has found, surprisingly, laser sensitive photopolymer lithographic plate based on hydrophilically treated electrochemically grained aluminum substrate with an optical density of at least 0.30 can give excellent photospeed and press durability while having clean background. The combination of higher optical density and hydrophilic treatment is unexpected for laser sensitive photopolymer plate, because higher optical density is expected to increase photospeed and press durability while hydrophilic treatment is expected to reduce photospeed and press durability; in addition, such darker substrate absorbs more laser energy and is considered less desirable in terms of utilizing the reflected laser to enhance photospeed, and is less desirable for inspection purpose because it gives lower contrast between the imaging areas and background areas of a processed plate.

SUMMARY OF THE INVENTION

This invention provides a negative-working laser sensitive lithographic printing plate comprising (i) an aluminum substrate; (ii) a photosensitive layer comprising a polymeric binder, a free radical polymerizable monomer, a free radical initiator, and a sensitizing dye; and (iii) a water soluble or dispersible overcoat; wherein said aluminum substrate is electrochemically grained (with or without desmut), anodized, and further treated with a hydrophilic material, and has a reflection optical density of at least 0.30 (preferably from 0.30 to 1.0, more preferably from 0.32 to 0.70, even more preferably from 0.34 to 0.60, and most preferably from 0.36 to 0.50). The photosensitive layer is sensitive to a laser having a wavelength selected from 200 to 1200 nm, such as a violet laser of about 405 nm, or an infrared laser of about 830 nm.

This invention further provides a method of exposing the above lithographic printing plate with a laser having a wavelength selected from 200 to 1200 nm according to digital imaging information to cause hardening of the photosensitive layer in the exposed areas.

This invention further provides a method of imagewise exposing the above lithographic printing plate with a laser to cause hardening of the photosensitive layer in the exposed areas and then developing the plate with an aqueous developer.

This invention further provides a method of imagewise exposing the above lithographic printing plate with a laser to cause hardening of the photosensitive layer in the exposed areas and then developing the plate with ink and/or fountain solution on a lithographic printing press during initial printing operation, wherein the photosensitive layer is soluble or dispersible in ink and/or fountain solution. The on-press developable plate can be imaged off press and then mounted on a lithographic printing press for on-press development with ink and/or fountain solution and lithographic printing. Alternatively, the plate can be imagewise exposed with a laser while mounted on a plate cylinder of a lithographic press, on-press developed on the same plate cylinder with ink and/or fountain solution, and then directly print images to the receiving sheets.

DETAILED DESCRIPTION OF THE PREFERRED EMBODIMENTS

The aluminum substrate suitable for the instant invention can be any aluminum sheet that has been electrochemically grained, anodized, and further treated with a hydrophilic material, with a reflection optical density of at least 0.30, preferably from 0.30 to 1.0, more preferably from 0.32to 0.70, even more preferably from 0.34 to 0.60, and most preferably from 0.36 to 0.50. The substrate may or may not be subject to desmut treatment after graining and before anodization.

The reflection optical density (also called optical density in this application) is measured by a reflection optical densitometer for the whole visible region. It measures the absorption of the reflected visible light by the aluminum substrate surface. Darker substrate gives higher reflection optical density. Suitable reflection optical densitometers include, for example, X-Rite and MacBeth reflection optical densitometers.

The aluminum substrate can be prepared from any aluminum sheet, including any pure aluminum or aluminum alloy. Suitable alloys of aluminum include alloys containing minor amounts of any of silicon, iron, copper, manganese, magnesium, zinc, titanium, chromium, nickel and the like.

In addition to electrochemical graining, the substrate can also be subjected to mechanical and/or chemical graining before electrochemical graining. Preferably, the substrate is subjected to electrochemical graining only or both mechanical graining and electrochemical graining (multigraining). All these substrates are considered electrochemically grained substrates in this instant patent.

Electrochemical graining (including multigraining) processes are well known and widely used in the manufacture of lithographic printing plates. There have been a great many different processes of electrochemical graining proposed for use in lithographic printing plate manufacturing. Processes of electrochemical graining are described, for example, in U.S. Pat. Nos. 3,755,116, 3,887,447, 3,935,080, 4,087,341, 4,201,836, 4,272,342, 4,294,672, 4,301,229, 4,396,468, 4,427,500, 4,468,295, 4,476,006, 4,482,434, 4,545,875, 4,548,683, 4,564,429, 4,581,996, 4,618,405, 4,735,696, 4,897,168, 4,919,774, and 5,368,974. All these processes and any other electrochemical graining processes can be used for the electrochemical graining of the instant invention.

Prior to electrochemical graining, the surface of the aluminum is usually cleaned to remove oil, dirt and grease therefrom. Suitable solvents and/or caustic solutions for carrying out such cleaning are well known in the art.

In an electrochemical graining process, the aluminum is treated, so as to increase its surface area and create a specific surface structure, by passing an electric current (usually an alternating electric current) from an electrode through an acid electrolyte to the aluminum. Typically, the aluminum that is conveyed through the electrolyte solution is in the form of a thin continuous web that may have a width of as much as two or more meters.

In carrying out electrochemical graining of aluminum, it is typical to utilize nitric or hydrochloric acid in admixture with the respective aluminum salt thereof. Other acids and many other types of chemical agents are also known for use in electrochemical graining baths. Electrodes, most commonly formed of graphite, are positioned to oppose the aluminum web at a distance ranging from about one-half centimeter to several centimeters. Either single phase or three phase alternating current is passed through the electrolyte so that at the interface between the solution and the aluminum a displacement reaction occurs whereby aluminum is oxidized to form either the chloride or nitrate salt which is soluble in the solution. By removing aluminum with the use of an electric current, a specific surface structure is obtained. Parameters such as temperature, electrolyte concentration, flow rates and electrode spacing are important in determining the characteristics of the surface structure produced.

The electrochemical graining can be carried out in a single-stage, two-stage, or multi-stage electrochemical graining process. For single-stage process, the aluminum passes through a single electrolytic solution, such as a solution comprised of nitric or hydrochloric acid and aluminum chloride, while applied with alternating electricity. For two-stage process, the aluminum passes through two different electrolytic solutions, while applied with alternating electricity; preferably the first stage has greater current density and shorter time than the second stage, as described in U.S. Pat. Nos. 5,122,243 and 5,186,795. For multi-stage process, the aluminum passes through more than one electrolytic solutions, while applied with alternating electricity when in each solution. Single-stage or two-stage electrochemical graining is preferred.

Upon the electrochemical graining process, the aluminum substrate surface changes from the original metallic or shining appearance to dark or gray color, due to the formation of micro structures on the surface as well as the formation of adhering dark particles. Such dark particles are commonly referred to as "smut". The electrochemically grained substrate is generally further etched with an alkaline or acid solution to remove the smut and modify the surface micro structure in order to eliminate ink scumming or toning tendency of the substrate. Such a process is called desmut. Suitable alkaline or acid etching solution for desmut include sodium hydroxide, nitric acid, sodium hydroxide followed by nitric acid (nitric acid also for neutralization), etc. The temperature and/or concentration of the desmut solution can be adjusted to achieve the preferred degree of desmut (degree of removal of the smut and etching of the surface microstructure, as measured by the reduced optical density). In the present invention, reduced degree of desmut (less desmut) or no desmut is preferably used in order to achieve a reflection optical density of 0.30 or higher (as measured for the final substrate used for coating the photosensitive layer); more preferably, less desmut is used. Less aggressive desmut condition, such as nitric acid desmut, lower-concentration sodium hydroxide desmut, lower temperature, or short dwell time can be used. The reduction on reflection optical density through the desmut process (from right after EC graining to right after desmut) is generally less than 0.60, preferably less than 0.40, more preferably less than 0.20, and most preferably less than 0.10, depending on the optical density of the substrate right after EC graining and with an overall object of achieving an optical density of 0.30 or higher for the final substrate.

In the lithographic plate manufacture industry, the concentrations of the standard desmut solutions vary widely for different manufacture lines, depending on the line speed and the length of the desmut bath as well as the smut generated in the EC graining process. For example, certain manufacture lines use 4-6% sodium hydroxide aqueous solution (usually with longer bath and/or less smut), some others use 45-50% sodium hydroxide aqueous solution (usually with shorter bath and/or more smut), and yet some others use 20% nitric acid aqueous solution. Here, the term "lower concentration" of the desmut solution is only relative to the standard concentration of the particular manufacture line. Likewise, the term "less desmut" or "reduced desmut" means that less aggressive desmut condition is used resulting in less reduction in optical density, compared to the standard desmut condition of the particular line. While relatively less desmut (or even no desmut) is generally recommended, any desmut condition can be used in this invention as long as it gives a reflection optical density of 0.30 or higher for the final aluminum substrate.

It is noted that, depending on the EC graining process, the reflection optical density of the EC grained aluminum (without desmut) can be very different. Accordingly, different degrees of desmut or no desmut are needed for aluminum with different EC graining processes, in order to achieve the reflection optical density required by this instant invention.

Upon completion of the electrochemical graining, and further desmut treatment if any, the aluminum is subjected to an anodization process utilizing an acid such as sulfuric acid and/or phosphoric acid. The anodization process serves to form an anodic oxide layer and is preferably controlled to create a layer of at least 0.1 $g/m^2$.

The electrochemically grained (with or without desmut), anodized aluminum is treated with a hydrophilic material to form a hydrophilic barrier layer. Suitable hydrophilic materials include metal silicate such as sodium silicate, phosphate fluoride (formed from a solution containing sodium dihydrogen phosphate and sodium fluoride, called phosphate fluoride solution), and hydrophilic polymer such as polyvinyl phosphonic acid, polyacrylamide, polyacrylic acid, polybasic organic acid, copolymers of vinyl phosphonic acid and acrylamide. Polyvinyl phosphonic acid and its copolymers are preferred polymers. The hydrophilic material can be formed on the aluminum surface by thermal or electrochemical method. By thermal method, the grained and anodized aluminum passes through or is immersed for a certain time in a solution containing the hydrophilic material at a certain temperature including elevated and room temperature. By electrochemical method, a DC or AC electricity is applied to the aluminum while passing through or immersed in the solution containing the hydrophilic material. Processes for forming a hydrophilic barrier layer on aluminum in lithographic printing plate application are well known in the art, and examples can be found in U.S. Pat. Nos. 2,714,066, 4,153,461, 4,399,021, 5,368,974, and 6,555,205.

The aluminum substrate has an average surface roughness Ra of from 0.1 to 1.0 μm, preferably from 0.2 to 0.6 μm, more preferably from 0.3 to 0.5 μm, and most preferably from 0.35 to 0.45 μm. Here the Ra is the average deviation of the "peaks" and "valleys" from the centerline on the substrate surface and is also called arithmetical roughness average. While higher Ra generally allows better adhesion of the photosensitive layer, lower Ra generally allows sharper imaging patterns.

The photosensitive layer of this invention comprises a polymeric binder, a free radical polymerizable monomer, a free-radical initiator, and a sensitizing dye, wherein said photosensitive layer is capable of hardening upon exposure to a laser having a wavelength selected from 200 to 1200 nm. At least the hardened photosensitive layer is oleophilic (receptive to ink and repellant to water); preferably, the photosensitive layer is oleophilic both before and after hardening. The photosensitive layer is developable with a liquid developer or with ink and/or fountain solution.

The monomer to polymer weight ratio is preferably larger than 0.5, more preferably larger than 1.0, further more preferably larger than 1.5, and most preferably larger than 2.0. Further, the photosensitive layer preferably comprises at least one monomer having at least 3 (meth)acrylate groups, and the weight ratio of the monomer having at least 3 (meth)acrylate groups (including all such monomers) to the polymeric binder (including all polymeric binders) is preferably larger than 1.0, more preferably larger than 1.5, and most preferably larger than 2.0.

In this patent, the term monomer includes both monomer and oligomer, and the term (meth)acrylate includes acrylate and methacrylate. In calculating the weight ratio of the monomer to the polymeric binder, the weight of the monomer includes the total weight of all monomers and the weight of the polymeric binder includes the total weight of all polymeric binders.

Infrared laser sensitive materials useful for the thermosensitive lithographic plates of this invention include, for example, thermosensitive compositions comprising a polymeric binder, a free-radical polymerizable monomer, a free radical initiator, and an infrared light absorbing dye.

Visible or ultraviolet light sensitive materials useful for violet or ultraviolet plates of this invention include, for example, photosensitive compositions comprising a polymeric binder, a free-radical polymerizable monomer, a free radical initiator, and a visible or ultraviolet light sensitizing dye.

Polymeric binder for the photosensitive layer of this invention can be any solid film-forming polymer. The polymers may or may not have (meth)acrylate groups or other polymerizable double bonds such as allyl groups. Examples of suitable polymers include (meth)acrylic polymers and copolymers (such as polybutylmethacrylate, polyethylmethacrylate, polymethylmethacrylate, polymethylacrylate, butylmethacrylate/methylmethacrylate copolymer, and methylmethacrylate/methylmethacrylic acid copolymer), polyvinyl acetate, polyvinyl butyrate, polyvinyl chloride, styrene/acrylonitrile copolymer, styrene/maleic anhydride copolymer and its partial ester, nitrocellulose, cellulose acetate butyrate, cellulose acetate propionate, vinyl chloride/vinyl acetate copolymer, butadiene/acrylonitrile copolymer, and polyurethane binder. For photosensitive layer developable with an alkaline aqueous developer, polymer with carboxylic acid groups is preferably used; the acid number is preferably at least 30, more preferably at least 50, and most preferably at least 70 mg KOH/g polymer.

Suitable free-radical polymerizable monomers (including oligomers) include, for example, multifunctional acrylate monomers or oligomers, such as (meth)acrylate esters of ethylene glycol, trimethylolpropane, pentaerythritol, ethoxylated ethylene glycol and ethoxylated trimethylolpropane, multifunctional urethanated (meth)acrylate, and epoxylated (meth)acrylate; and oligomeric amine diacrylates. The monomer preferably has at least two (meth)acrylate groups, more preferably at least three functional groups, even more preferably at least four function groups, and most preferably at least six functional groups. Urethanated (meth)acrylate with at least six (meth)acrylate groups are particularly useful because of their fast curing speed. Combinations of urethanated (meth)acrylate and non-urethanated (meth)acrylate are especially useful. Various monomer combinations are described in U.S. Pat. No. 6,902,866, the entire disclosure of which is hereby incorporated by reference, and can be used for the preparation of the photosensitive layer of this invention.

Suitable free-radical initiators include, for example, the derivatives of acetophenone (such as 2,2-dimethoxy-2-phenylacetophenone, and 2-methyl-1-[4-(methylthio)phenyl]-2-morpholino propan-1-one), onium salts such as diaryliodonium hexafluoroantimonate, diaryliodonium hexafluorophosphate, diaryliodonium triflate, (4-(2-hydroxytetradecyl-oxy)phenyl)phenyliodonium hexafluoroantimonate, (4-octoxyphenyl)phenyliodonium hexafluoroantimonate, bis(4-t-butylphenyl)iodonium hexafluorophosphate, triarylsulfonium hexafluorophosphate, triarylsulfonium p-toluenesulfonate, (3-phenylpropan-2-onyl)triaryl phosphonium hexafluoroantimonate and N-ethoxy(2-methyl)pyridinium hexafluorophosphate, and the onium salts as described in U.S. Pat. Nos. 5,955,238, 6,037,098 and 5,629,354; borate salts such as tetrabutylammonium triphenyl(n-butyl)borate, tetraethylammonium triphenyl(n-butyl)borate, diphenyliodonium tetraphenylborate, and triphenylsulfonium triphenyl(n-butyl)borate, and the borate salts as described in U.S. Pat. Nos. 6,232,038 and 6,218,076; haloalkyl substituted s-triazines such as 2,4-bis(trichloromethyl)-6-(p-methoxy-styryl)-s-triazine, 2,4-bis(trichloromethyl)-6-(4-methoxy-naphth-1-yl)-s-triazine, 2,4-bis(trichloromethyl)-6-piperonyl-s-triazine, and 2,4-bis(trichloromethyl)-6-[(4-ethoxyethylenoxy)-phen-1-yl]-s-triazine, and the s-triazines as described in U.S. Pat. Nos. 5,955,238, 6,037,098, 6,010,824, and 5,629,354; titanocene such as bis($\eta^9$-2,4-cyclopentadien-1-yl)bis[2,6-difluoro-3-(1H-pyrrol-1-yl)phenyl)titanium; hexaarylbiimidazole compounds such as 2,2'-bis(2-chlorophenyl)-4,4',5,5'-tetraphenyl-1,1'-biimidazole, 2,2'-bis(2-ethoxyphenyl)-4,4',5,5'-tetraphenyl-1,1'-biimidazole, 2-(1-naphthyl)-4,5-diphenyl-1,2'-biimidazole; and derivatives of acetophenone such as 2,2-dimethoxy-2-phenylacetophenone, and 2-methyl-1-[4-(methylthio)phenyl]-2-morpholino propan-1-one. Triarylsulfonium salts, diaryliodonium salts, and triarylalkylborate salts are particularly suitable for infrared laser sensitive plate. Titanocene compounds and hexaarylbiimidazole compounds are particularly suitable for violet or ultraviolet laser sensitive plate. The initiator is added in the photosensitive layer preferably at 0.1 to 40% by weight of the photosensitive layer, more preferably 1 to 30%, and most preferably 5 to 20%.

Infrared laser sensitizing dyes useful in the infrared sensitive photosensitive layer (also called thermosensitive layer) of this invention include any infrared absorbing dye effectively absorbing an infrared radiation having a wavelength of 750 to 1200 nm. It is preferable that the dye has an absorption maximum between the wavelengths of 800 and 1100 nm. Various infrared absorbing dyes are described in U.S. Pat. Nos. 5,858,604, 5,922,502, 6,022,668, 5,705,309, 6,017,677, and 5,677,106, and in the book entitled "Infrared Absorbing Dyes" edited by Masaru Matsuoka, Plenum Press, New York (1990), and can be used in the thermosensitive layer of this invention. Examples of useful infrared absorbing dyes include squarylium, croconate, cyanine (including polymethine), phthalocyanine (including naphthalocyanine), merocyanine, chalcogenopyryloarylidene, oxyindolizine, quinoid, indolizine, pyrylium and metal dithiolene dyes. Cyanine and phthalocyanine dyes are preferred infrared absorbing dyes.

Violet or ultraviolet laser sensitizing dyes useful in the violet or ultraviolet sensitive photosensitive layer of this invention include any violet or ultraviolet absorbing dyes having an absorption maximum of from 200 to 450 nm and capable of directly or indirectly causing polymerization of the monomers upon exposure to the corresponding laser. Usually, the violet or ultraviolet absorbing dye activates an initiator to cause the polymerization of the monomer upon exposure to a laser. For plate sensitive to a violet laser (390 to 430 nm), the violet absorbing dye preferably has an absorption maximum of from 350 to 430 nm, and more preferably from 360 to 400 nm; here the slightly lower wavelength maximum than the laser wavelength allows better room light stability. For plate sensitive to an ultraviolet laser (200 to 390 nm), the ultraviolet absorbing dye preferably has an absorption maximum of from 200 to 390 nm. Suitable violet or ultraviolet absorbing dyes include, for example, cyanine dyes; chromanone compounds such as 4-diethylaminobenzilidene chromanone; dialkylaminobenzene compounds such as ethyl 4-dimethylaminobenzoate and dialkylaminobenzene; dialkylaminobenzophenone compounds such as 4,4'-bis(dimethylamino)benzophenone, 4,4'-bis(diethylamino)benzophenone, 2-(p-dimethylaminophenyl)benzooxazole, 2-(p-diethylaminophenyl)benzooxazole, 2-(p-dimethylaminophenyl)benzo[4,5]benzooxazole, 2-(p-dimethylaminophenyl)benzo[6,7]benzooxazole, 2,5-bis(p-diethylaminophenyl)1,3,4-oxazole, 2-(p-dimethylaminophenyl)benzothiazole, 2-(p-diethylaminophenyl)benzothiazole, 2-(p-dimethylaminophenyl)benzimidazole, 2-(p-diethylaminophenyl)benzimidazole, 2,5-bis(p-diethylaminophenyl)1,3,4-thiadiazole, (p-dimethylaminophenyl)pyridine, (p-diethylaminophenyl)pyridine, 2-(p-dimethylaminophenyl)quinoline, 2-(p-diethylaminophenyl)quinoline, 2-(p-dimethylaminophenyl)pyrimidine or 2-(p-diethylaminophenyl)pyrimidine; unsaturated cyclopentanone compounds such as 2,5-bis{[4-(diethylamino)phenyl]methylene}-(2E,5E)-(9Cl)-cyclopentanone and bis(methylindolenyl)cyclopentanone; coumarin compounds such as 3-benzoyl-7-methoxy coumarin and 7-methoxy coumarin; and thioxanthene compounds such as 2-isopropylthioxanthenone. Dialkylaminobenzene and dialkylaminobenzophenone compounds (including bis(dialkylamino)benzophenone compounds) are particularly suitable for ultraviolet laser sensitive plate. Dialkylaminobenzophenone compounds (including bis(dialkylamino)benzophenone compounds) are particularly suitable for violet laser sensitive plate. The sensitizing dyes as described in U.S. Pat. Nos. 5,422,204 and 6,689,537, and U.S. Pat. App. Pub. No. 2003/0186165 can be used for the photosensitive layer of this invention.

Suitable visible laser sensitive dyes useful in the visible (other than violet) laser sensitive photosensitive layer of this invention include any visible laser absorbing dyes having an absorption maximum of from 400 to 600 nm and capable of directly or indirectly causing polymerization of the monomers upon exposure to the corresponding laser. Suitable visible laser absorbing dyes include, for example, cyanine dyes; chromanone compounds such as 4-diethylaminobenzilidene chromanone; rhodamine compounds such as rhodamine 6G perchloride; unsaturated cyclopentanone compounds such as 2,5-bis{[4-(diethylamino)phenyl]methylene}-(2E,5E)-(9Cl)-cyclopentanone and bis(methylindolenyl)cyclopentanone; coumarin compounds such as 3-benzoyl-7-methoxy coumarin and 7-methoxy coumarin; and phthalocyanine compounds.

The photosensitive composition of the present invention preferably contains a hydrogen-donor compound as a polymerization accelerator. Examples of the hydrogen-donor compound include compounds having a mercapto group such as 2-mercaptobenzothiazole, 2-mercaptobenzimidazole, 2-mercaptobenzoxazole and 3-mercapto-1,2,4-triazole; N,N-dialkyl benzoic alkyl ester; and N-aryl-α-amino acids and their salts and esters such as N-phenylglycine, salts of N-phenylglycine, and alkyl esters of N-phenylglycine such as N-phenylglycine ethyl ester and N-phenylglycine benzyl ester.

In order to be useful for the on-press developable plate of this invention, the photosensitive layer must be capable of hardening upon exposure to a laser, and the non-hardened areas of the photosensitive layer must be soluble or dispersible in ink and/or fountain solution and can be developed off on a lithographic press with ink and/or fountain solution.

Various surfactants can be added into the photosensitive layer to allow or enhance the on-press developability with ink and/or fountain solution or developability with aqueous solution. Both polymeric and small molecule surfactants can be used. However, it is preferred that the surfactant has low or no volatility so that it will not evaporate from the photosensitive layer of the plate during storage and handling. Nonionic surfactants are preferred. The nonionic surfactant used in this invention should have sufficient portion of hydrophilic segments (or groups) and sufficient portion of oleophilic segments (or groups), so that it is at least partially soluble in water (>1 g surfactant soluble in 100 g water) and at least partially soluble in organic phase (>1 g surfactant soluble in 100 g photosensitive layer). Preferred nonionic surfactants are polymers and oligomers containing one or more polyether (such as polyethylene glycol, polypropylene glycol, and copolymer of ethylene glycol and propylene glycol) segments. Examples of preferred nonionic surfactants are block copolymers of propylene glycol and ethylene glycol (also called block copolymer of propylene oxide and ethylene oxide); ethoxylated or propoxylated acrylate oligomers; and polyethoxylated alkylphenols and polyethoxylated fatty alcohols. For on-press developable plate, the nonionic surfactant is preferably added at from 0.1 to 30% by weight of the photosensitive layer, more preferably from 0.5 to 20%, and most preferably from 1 to 15%. For plate developable with a regular liquid developer, the nonionic surfactant is preferably added at from 0 to 10% by weight of the photosensitive layer, more preferably from 0.1 to 5% and most preferably from 0.2 to 2%.

A thin water-soluble interlayer may be deposited between the aluminum substrate and the photosensitive layer. Here the substrate surface is rough and/or porous enough and the interlayer is thin enough to allow bonding between the photosensitive layer and the substrate through mechanical interlocking. Such a plate configuration is described in U.S. Pat. No. 6,014,929, the entire disclosure of which is hereby incorporated by reference. Preferred releasable interlayer comprises a water-soluble polymer. Polyvinyl alcohol (including various water-soluble derivatives of polyvinyl alcohol) is the preferred water-soluble polymer. Usually pure water-soluble polymer is coated. However, one or more surfactant and other additives may be added. The water-soluble polymer is generally coated from an aqueous solution with water as the only solvent. A water-soluble organic solvent, preferably an alcohol such as ethanol or isopropanol, can be added into the water-soluble polymer aqueous coating solution to improve the coatability. The water-soluble organic solvent is preferably added at less than 30% by weight of the solution, more preferably at less than 10%. The releasable interlayer preferably has an average coverage of 1 to 200 mg/m$^2$, more preferably 2 to 100 mg/m$^2$, and most preferably 4 to 40 mg/m$^2$.

The photosensitive layer may be conformally coated onto the aluminum substrate at thin coverage (for example, of less than 1.2 g/m$^2$) so that the plate can have microscopic peaks and valleys on the photosensitive layer coated surface and exhibit low tackiness and good block resistance, as described in U.S. Pat. No. 6,242,156, the entire disclosure of which is hereby incorporated by reference.

The photosensitive layer of this invention can be solid or semisolid at 25° C. In one embodiment, semisolid photosensitive layer is preferably used to achieve fast photospeed, and/or developability with ink and/or fountain solution or with an aqueous developer. Here the term semisolid photosensitive layer is defined as a photosensitive layer which, when coated on a flat and smooth surface at a thickness of at least 1 micron, is able to form fingerprints when pressed with a finger at a force (or weight) of 2 kg and is tacky to touch by fingers at 25° C.

The water soluble or dispersible overcoat preferably comprises a water-soluble polymer, such as polyvinyl alcohol (including various water-soluble derivatives of polyvinyl alcohol). Combination of two or more water-soluble polymers (such as a combination of polyvinyl alcohol and polyvinylpyrrolidone) may also be used. Polyvinyl alcohol is a preferred water-soluble polymer. Various additives, such as surfactant, wetting agent, defoamer, leveling agent and dispersing agent, can be added into the overcoat formulation to facilitate, for example, the coating or development process. Examples of surfactants useful in the overcoat of this invention include polyethylene glycol, polypropylene glycol, and copolymer of ethylene glycol and propylene glycol, polysiloxane surfactants, perfluorocarbon surfactants, alkylphenyl ethylene oxide condensate, sodium dioctylsulfosuccinate, sodium dodecylbenzenesulfonate, and ammonium laurylsulfate. Various organic or inorganic emulsion or dispersion may be added into the overcoat to, for example, reduce the tackiness or moisture sensitivity of the plate. For on-process developable plate, the overcoat preferably has a coverage of from 0.001 to 3.0 g/m$^2$, more preferably from 0.01 to 1.0 g/m$^2$, and more preferably from 0.05 to 0.5 g/m$^2$. For plate developable with a regular liquid developer, the overcoat preferably has a coverage of from 0.1 to 5.0 g/m$^2$, more preferably from 0.5 to 3.0 g/m$^2$, and more preferably from 1.0 to 2.0 g/m$^2$.

In a preferred embodiment for the thermosensitive lithographic plates of this invention, the photosensitive layer (also called thermosensitive layer) comprises at least one polymeric binder (with or without ethylenic functionality), at least one polymerizable ethylenically unsaturated monomer having at least one terminal ethylenic group, at least one free-radical initiator, and at least one infrared absorbing dye or pigment. Other additives such as surfactant, dye or pigment, exposure-indicating dye (such as leuco crystal violet, leucomalachite green, azobenzene, 4-phenylazodiphenylamine, and methylene blue dyes), and free-radical stabilizer (such as methoxyhydroquinone) may be added. The monomer-to-polymer weight ratio is preferably larger than 1.0, more preferably larger than 1.5, and most preferably larger than 2.0.

In another preferred embodiment for thermosensitive lithographic plates of this invention, the photosensitive layer comprises a polymeric binder, a (meth)acrylate monomer having at least 3 (meth)acrylate groups, a free-radical initiator, and an infrared absorbing dye. The weight ratio of all the (meth)acrylate monomers having at least 3 (meth)acrylate groups to all the polymeric binders is larger than 1.0, preferably larger than 1.5, and most preferably larger than 2.0. Optionally, other (meth)acrylate monomer having less than 3 (meth)acrylate groups can be added.

In yet another preferred embodiment for the thermosensitive lithographic plates of this invention, the thermosensitive layer comprises a polymeric binder, a urethane (meth) acrylate monomer having at least 6 (meth)acrylate groups, a non-urethane (meth)acrylate monomer having at least 4 (meth)acrylate groups, a free-radical initiator, and an infrared absorbing dye. The weight ratio of the urethane (meth) acrylate monomer to the non-urethane (meth)acrylate monomer is preferably from 0.10 to 3.0, more preferably from 0.15 to 2.0, even more preferably from 0.20 to 1.5, and most preferably from 0.30 to 1.0.

In a preferred embodiment for violet or ultraviolet laser sensitive lithographic plates of this invention, the photosensitive layer comprises at least one polymeric binder (with or without ethylenic functionality), at least one polymerizable ethylenically unsaturated monomer having at least one terminal ethylenic group, at least one free-radical initiator, and at least one violet or ultraviolet sensitizing dye. Other additives such as surfactant, dye or pigment, exposure-indicating dye, and free-radical stabilizer may be added. The monomer-to-polymer weight ratio is preferably larger than 1.0, more preferably larger than 1.5, and most preferably larger than 2.0.

In another preferred embodiment for violet or ultraviolet laser sensitive lithographic plates of this invention, the photosensitive layer comprises a polymeric binder, a (meth) acrylate monomer having at least 3 (meth)acrylate groups, a free-radical initiator, and a violet or ultraviolet sensitizing dye. The weight ratio of all the (meth)acrylate monomers having at least 3 (meth)acrylate groups to all the polymeric binders is larger than 1.0, preferably larger than 1.5, and most preferably larger than 2.0. Optionally, other (meth) acrylate monomer having less than 3 (meth)acrylate groups can be added.

In yet another preferred embodiment for violet or ultraviolet laser sensitive lithographic plates of this invention, the photosensitive layer comprises a polymeric binder, a urethane (meth)acrylate monomer having at least 6 (meth) acrylate groups, a non-urethane (meth)acrylate monomer having at least 4 (meth)acrylate groups, a free-radical initiator, and a violet or ultraviolet sensitizing dye. The weight ratio of the urethane (meth)acrylate monomer to the non-urethane (meth)acrylate monomer is preferably from 0.10 to 3.0, more preferably from 0.15 to 2.0, even more preferably from 0.20 to 1.5, and most preferably from 0.30 to 1.0.

In further another preferred embodiment for violet or ultraviolet laser sensitive lithographic plates of this invention, the photosensitive layer comprises a polymeric binder (with or without ethylenic functionality), a polymerizable ethylenically unsaturated monomer having at least four terminal ethylenic group, a titanocene or hexaarylbiimidazole compound, and a dialkylaminobenzophenone compound. A hydrogen-donor compound, such as 2-mercaptobenzothiazole, 2-mercaptobenzimidazole, 2-mercaptobenzoxazole, 3-mercapto-1,2,4-triazole, N,N-dialkyl benzoic alkyl ester, N-phenylglycine ethyl ester and N-phenylglycine benzyl ester, is preferably added. Other additives such as surfactant, dye or pigment, exposure-indicating dye, and free-radical stabilizer may be added. The monomer-to-polymer weight ratio is preferably larger than 1.0, more preferably larger than 1.5, and most preferably larger than 2.0.

The compositions as described in U.S. Pat. Nos. 6,482, 571, 6,576,401, 5,548,222, 6,541,183, 6,902,865, and 6,902, 866, the entire disclosures of which are hereby incorporated by reference, can be used for the laser sensitive plates of the instant invention.

A hydrophilic or oleophilic micro particles may be added into the photosensitive layer to enhance, for example, the developability and non-tackiness of the plate. Suitable micro particles include polymer particles, talc, titanium dioxide, barium sulfate, silicone oxide, and aluminum micro particles, with an average particle size of less than 10 microns, preferably less than 5 microns, more preferably less than 2 microns, and most preferably less than 1 microns. A suitable particular dispersion is described in U.S. Pat. No. 6,071,675, the entire disclosure of which is hereby incorporated by reference.

The photosensitive layer can be coated from a solution (usually organic solvent based solution) through a well-known coating method, such as roller coating, slid coating, or spray coating. The overcoat or the interlayer can be coated from an aqueous solution or dispersion through a well-known coating method, such as roller coating, slid coating, spray coating, squeegee coating, or dip coating. The coated photosensitive layer, overcoat, or interlayer can be dried with heat, radiation, and/or forced air. Preferably, the coating is heated to an elevated temperature, such as 90 or 110° C. to ensure the complete removal of the solvent or water.

Infrared lasers useful for the imagewise exposure of the thermosensitive plates of this invention include laser sources emitting in the near infrared region, i.e. emitting in the wavelength range of from 750 to 1200 nm, and preferably from 800 to 1100 nm. Particularly preferred infrared laser sources are laser diodes emitting around 830 nm or a NdYAG laser emitting around 1060 nm. The plate is exposed at a laser dosage that is sufficient to cause hardening in the exposed areas but not high enough to cause substantial thermal ablation. The exposure dosage is preferably from 1 to 400 mJ/cm$^2$, more preferably from 5 to 200 mJ/cm$^2$, and most preferably from 20 to 100 mJ/cm$^2$, depending on the sensitivity of the thermosensitive layer.

Visible lasers useful for the imagewise exposure of the visible light sensitive plates of this invention include any laser emitting in the wavelength range of from 390 to 600 nm. Examples of suitable visible lasers include frequency-doubled Nd/YAG laser (about 532 nm), argon ion laser (about 488 nm), violet diode laser (about 405 nm, or from 390 to 430 nm), and visible LEDs. Violet laser diode is especially useful because of its small size and relatively lower cost. The exposure dosage is preferably from 0.0001 to 1 mJ/cm$^2$ (0.1 to 1000 µJ/cm$^2$), more preferably from 0.001 to 0.3 mJ/cm$^2$ (1 to 300 µJ/cm$^2$), and most preferably from 0.005 to 0.10 mJ/cm$^2$ (5 to 100 µJ/cm$^2$), depending on the sensitivity of the photosensitive layer.

Ultraviolet lasers useful for the imagewise exposure of the ultraviolet light sensitive plates of this invention include any laser having a wavelength of from 200 to 390 nm. Examples of ultraviolet lasers include ultraviolet diode lasers or LEDs having a wavelength of from 350 to 390 nm. Laser diodes are preferred ultraviolet lasers. The exposure dosage is preferably from 0.0001 to 1 mJ/cm$^2$ (0.1 to 1000 µJ/cm$^2$), more preferably from 0.001 to 0.3 mJ/cm$^2$ (1 to 300 µJ/cm$^2$), and most preferably from 0.005 to 0.10 mJ/cm$^2$ (5 to 100 µJ/cm$^2$), depending on the sensitivity of the photosensitive layer.

Laser imaging devices are currently widely available commercially. Any device can be used which provides imagewise laser exposure according to digital imaging information. Commonly used imaging devices include flatbed imager, internal drum imager, and external drum imager, all of which can be used for the imagewise laser exposure in this invention.

The on-press developable plate is usually exposed on an exposure device, and then mounted on press to develop with ink and/or fountain solution and then print out regular printed sheets. However, the plate can also be exposed on a printing press (such as by mounting on the plate cylinder or sliding through a flatbed imager mounted on the press), and the exposed plate can be directly developed on press with ink and/or fountain solution and then print out regular printed sheets. The ink and/or fountain solution-solubilized or dispersed photosensitive layer and/or overcoat can be mixed into the ink and/or the fountain solution on the rollers, and/or can be transferred to the blanket and then the receiving medium (such as paper). The fountain solution roller is engaged (to the plate cylinder as for conventional inking system or to the ink roller as for integrated inking system) for preferably 0 to 100 rotations, more preferably 1 to 50 rotations and most preferably 5 to 20 rotations (of the plate cylinder), and the ink roller is then engaged to the plate cylinder for preferably 0 to 100 rotations, more preferably 1 to 50 rotations and most preferably 5 to 20 rotations before engaging the plate cylinder and feeding the receiving medium (such as paper). Good quality prints should be obtained preferably under 40 initial impressions, more preferably under 20 impressions, and most preferably under 5 impressions.

For conventional wet press, usually fountain solution is applied (to contact the plate) first, followed by contacting with ink roller. For press with integrated inking/dampening system, the ink and fountain solution are emulsified by various press rollers before being transferred to the plate as emulsion of ink and fountain solution. However, in this invention, the ink and fountain solution may be applied at any combination or sequence, as needed for the plate. There is no particular limitation. The recently introduced single fluid ink that can be used for printing wet lithographic plate without the use of fountain solution, as described in for example U.S. Pat. No. 6,140,392, can also be used for the plate of this invention.

The on-press developable plate may be rinsed or applied with an aqueous solution, including water and fountain solution, to remove the water soluble or dispersible overcoat and to dampen without developing the plate, after imagewise exposure and before on-press development with ink and/or fountain solution. The aqueous solution can be formulated with a deactivating agent so that it deactivates the photosensitive layer, preventing any hardening of the photosensitive layer in the non-exposed areas and allowing handling of the plate under regular light. The application of such aqueous solution with a deactivating agent is especially useful for violet laser sensitive on-press developable plate.

The ink used in this application can be any ink suitable for lithographic printing. Most commonly used lithographic inks include "oil based ink" which crosslinks upon exposure to the oxygen in the air and "rubber based ink" which does not crosslink upon exposure to the air. Specialty inks include, for example, radiation-curable ink and thermally curable ink. An ink is an oleophilic, liquid or viscous material which generally comprises a pigment dispersed in a vehicle, such as vegetable oils, animal oils, mineral oils, and synthetic resins. Various additives, such as plasticizer, surfactant, drier, drying retarder, crosslinker, and solvent can be added to achieve certain desired performance. The compositions of typical lithographic inks are described in "The Manual of Lithography" by Vicary, Charles Scribner's Sons, New York, and Chapter 8 of "The Radiation Curing: Science and Technology" by Pappas, Plenum Press, New York, 1992.

The fountain solution used in this application can be any fountain solution used in lithographic printing. Fountain solution is used in the wet lithographic printing press to dampen the hydrophilic areas (non-image areas), repelling ink (which is hydrophobic) from these areas. Fountain solution contains mainly water, generally with addition of certain additives such as gum arabic and surfactant. Small amount of alcohol such as isopropanol can also be added in the fountain solution. Water is the simplest type of fountain solution. Fountain solution is usually neutral to mildly acidic. However, for certain plates, mildly basic fountain solution is used. The type of fountain solution used depends on the type of the plate substrate as well as the plate. Various fountain solution compositions are described in U.S. Pat. Nos. 4,030,417 and 4,764,213.

In one embodiment of this instant invention, the laser exposure and the on-press development are independently performed with the plate under a lighting that contains no or substantially no radiation below a wavelength selected from 400 to 650 nm, or in the dark or substantially dark; preferably under a lighting that contains no radiation below a wavelength selected from 400 to 650 nm, or in the dark. Such lighting is usually a yellow or red light. This includes a light that is from a fluorescence or incandescence lamp that is covered with a filter that cuts off all or substantially all (at least 99%) of the radiation below a wavelength selected from 400 to 650 nm; preferably the lamp is covered with a filter that cuts off all of the radiation below a wavelength selected from 400 to 650 nm. The laser exposure and the on-press development can be performed with the plate under the same or different lightings. Such a process is described in U.S. patent application Ser. No. 11,057,663, the entire disclosure of which is hereby incorporated by reference.

For plate developable with a regular liquid developer, any liquid developer is suitable which can effectively remove the non-exposed areas of the photosensitive layer. Preferred are aqueous developers, which include alkaline aqueous developers and non-alkaline aqueous developers. For plate having an alkaline insoluble polymeric binder, non-alkaline aqueous developer is preferred. For plate having an alkaline soluble polymeric binder, alkaline aqueous developer is preferred.

The non-alkaline aqueous developer (as defined in this application) comprises 60-99% by weight of water and 0.5 to 40% by weight of an alcohol solvent and having a pH of less than 8.5. The alcohol solvent is defined as a water-soluble liquid organic compound having at least one hydroxyl group. The alcohol solvent must be soluble in water at the added concentration. Liquid alkyl alcohol (including arylalky alcohol) and its liquid derivatives are preferred alcohol solvents. Alcohol solvents useful for the developer of this invention include, for example, various liquid water-soluble alkyl alcohol, arylalkyl alcohol, alkoxyalkyl alcohol, arylalkoxyalkyl alcohol, aroxyalkyl alcohol, oxydialkanol, and alkyl lactate. Other functional group, such as ester, ether, epoxy, or ethylenic group, may be attached to the alkyl or aryl group. Examples of useful alcohol solvents are benzyl alcohol, phenethyl alcohol, isopropyl alcohol, 1-propyl alcohol, ethyl alcohol, butyl alcohol, ethyl lactate, propyl lactate, butyl lactate, methoxyethanol, ethoxyethanol, propoxyethanol, butoxyethanol, methoxypropanol, ethoxypropanol, propoxypropanol, butoxypropanol, diethylene glycol (2,2'-oxydiethanol), phenoxyethanol, and phenoxypropanol. For the alcohols with isomers, all liquid isomers can be used. Benzyl alcohol is a particularly useful alcohol solvent. Usually one alcohol solvent is used in the developer. However, two or more alcohol solvents can also be used in the same developer. The alcohol solvent is added preferably at 1 to 30% by weight of the developer and more preferably at 2 to 10%. The non-alkaline aqueous developer preferably has a pH of 4.0 to 8.4 and more preferably 6.0 to 8.0. While a pH of close to neutral (pH of about 7.0) is preferred, the pH may be slightly to moderately basic or acidic due to addition of certain additives for improving, for example, the hydrophilicity of the substrate. For example, phosphoric acid or citric acid may be added to improve the hydrophilicity of certain substrate; and small amount of diethanolamine may be added to adjust the pH to slightly basic to improve the hydrophilicity of certain substrate.

The alkaline aqueous developer (as defined in this application) is an aqueous solution comprising 60-99% by weight of water, and 0.2 to 20% by weight of alkaline compound, and having a pH of at least 8.5. The alkaline compound is preferably added at 0.5 to 10% and more preferably 1.0 to 5.0% by weight of the developer solution. The pH is preferably from 9.0 to 13.5, more preferably from 9.5 to 13.0, and most preferably from 10.0 to 12.0. More than one alkaline compound can be used. Suitable alkaline compounds include inorganic alkaline compounds such as potassium silicate, sodium silicate, sodium carbonate, potassium carbonate, potassium hydroxide and sodium hydroxide, and organic amine compounds such as triethylamine, diethylamine, triethanolamine and diethanolamine. An alcohol solvent can be added to improve the developability. Suitable water soluble organic solvents include, for example, benzyl alcohol, phenethyl alcohol, isopropyl alcohol, 1-propyl alcohol, ethyl alcohol, butyl alcohol, ethyl lactate, propyl lactate, butyl lactate, methoxyethanol, ethoxyethanol, propoxyethanol, butoxyethanol, methoxypropanol, ethoxypropanol, propoxypropanol, butoxypropanol, diethylene glycol (2,2'-oxydiethanol), phenoxyethanol, and phenoxypropanol. The alcohol solvent is preferably added at less than 10% by weight of the developer, more preferably at less than 5%, and most preferably no alcohol solvent is added.

One or more surfactants are preferably added into the above developers to, for example, help the wetting of the developer on the plate, improve the developability, reduce solid residue in the developer, and condition the bared substrate. Either ionic or nonionic water-soluble surfactant or both can be used. Examples of useful surfactants include polyethylene glycol, polypropylene glycol, and copolymer of ethylene glycol and propylene glycol, polysiloxane surfactants, ionic perfluorocarbon surfactants, nonionic perfluorocarbon surfactants, sodium dioctylsulfosuccinate, sodium dodecylbenzenesulfonate, sodium butylnaphthalenesulfate, sodium alkylnaphthalenesulfate, sodium cumenesulfonate, and ammonium laurylsulfate. The surfactant is preferably added at from 0.01 to 20% by weight of the developer, more preferably from 0.1 to 10%, and most preferably from 1 to 5%. Various other additives, such as defoamer, bactericide, dye, and substrate conditioner (such as gum arabic, and maltodextrin), can be added. Certain salts, such as sodium chloride, potassium phosphate and ammonium sulfite, may be added to, for example, improve the hydrophilicity of the bared substrate.

For plate developable with a regular liquid developer, optionally, the plate can be pre-washed with water to remove the water soluble or dispersible overcoat before developed with the developer. This will help reduce contamination to the developer and improve the development efficiency.

The invention is further illustrated by the following non-limiting examples of its practice.

EXAMPLES 1-10

Two aluminum sheets (3 in.×6 in.×0.008 in.) were degreased by dipping in a 3.0% by weight sodium hydroxide aqueous solution for 2 minutes and rinsed with running water. The degreased aluminum sheets were then placed face-to-face at 2 inches apart in a 2.0% by weight hydrochloric acid aqueous solution. Each aluminum sheet was connected to one of the two outputs of an AC electric source. AC current of about 8 Ampere (at about 80 Volt) was passed through for 60 seconds. The electrochemically grained (EC grained) aluminum sheets were then rinsed with running water. Multiple sheets of EC grained aluminum were prepared according to this procedure. The EC grained aluminum sheets prepared above were subjected to different desmut treatments for about 5 seconds as described in Table 1.

The EC grained aluminum substrates (with or without desmut) were subjected to DC electrochemical anodization at 12 volt in a 20% by weight sulfuric acid aqueous solution for 60 seconds, followed by running tap water rinse. The grained and anodized aluminum sheets were immersed in a 0.1% by weight polyvinyl phosphonic acid (PVPA) aqueous solution at 80° C. for 4 minutes, followed by rinse with running water and drying in an oven at 110° C. for 2 minutes.

Aluminum sheets without desmut and/or PVPA treatments were also prepared at the same time as controls.

The reflection optical densities of the substrates were measured with an X-Rite reflection optical densitometer using visible mode (clear mode). The optical densities as well as the treatments of the samples (including the controls) are listed in Table 1.

The above treated aluminum sheets were first coated with a 0.2% by weight aqueous solution of polyvinyl alcohol (Celvol 540, from Celanese) with a #6 Meyer rod, followed by drying in an oven at 110° C. for 2 min. The polyvinyl alcohol coated substrate was further coated with the photosensitive layer formulation PS-1 with a #8 Meyer rod, followed by drying in an oven at 110° C. for 2 min.

| PS-1 | |
| --- | --- |
| Component | Weight ratios |
| Neocryl B-728 (Polymer from Zeneca) | 3.193 |
| Sartomer SR-399 (Acrylic monomer from Sartomer) | 7.630 |
| Pluronic L43 (Nonionic surfactant from BASF) | 0.649 |
| 2,2-Bis(2-chlorophenyl)-4,4',5,5'-tetraphenyl-1,1'-biimidazole | 1.407 |
| 4,4'-Bis(diethylamino)benzophenone | 0.839 |
| 2-Mercaptobenzoxazole | 0.281 |
| 2-Butanone | 86.000 |

The photosensitive layer coated plate was further coated with a water-soluble overcoat OC-1 using a #6 Meyer rod, followed by drying in an oven at 110° C. for 2 min. The above coating and drying processes were under a dim yellow light.

| OC-1 | |
| --- | --- |
| Component | Weight ratios |
| Airvol 203 (Polyvinyl alcohol from Air Products) | 5.00 |
| Zonyl FSO (Perfluorinated surfactant from DuPont) | 0.02 |
| Water | 95.00 |

The above plates were exposed with a violet plate imager equipped with a 60-mw violet laser diode emitting at about 405 nm (MAKO-4 from ECRM) for a dosage of about 120

μJ/cm². Each plate is taped onto a larger plate (10 in.×15 in.) to pass through the flatbed imager. The plate was imaged in an orange light room (with a cut off wavelength of 530 nm), and was kept in a light tight box before and after imaging.

The exposed plates were tested on a wet lithographic press (AB Dick 360) under a dim yellow light. The plate was directly mounted on the plate cylinder of the press using double-sided adhesive tapes. After starting the press, the fountain roller was engaged for 20 rotations, the ink roller (carrying emulsion of ink and fountain solution) was applied to the plate cylinder for 20 rotations, and the plate cylinder was then engaged with the blanket cylinder and printed with paper. The press continued to run for 200 impressions. The printed sheets were evaluated for the cleanness of the non-imaging areas (background) and the image durability. The results are summarized in Table 1.

TABLE 1

| Sample ID | Desmut Solution | PVPA Treatment | Reflection Optical Density | Background | Image Durability |
|---|---|---|---|---|---|
| A | 20% NaOH | Yes | 0.26 | Clean | Poor |
| B | 2% NaOH | Yes | 0.38 | Clean | Good |
| C | 20% Nitric acid | Yes | 0.37 | Clean | Good |
| D | 10% Nitric acid | Yes | 0.43 | Clean | Good |
| E | No desmut | Yes | 0.48 | Clean | Good |
| F | 20% NaOH | No | 0.26 | Toning | Good |
| G | 2% NaOH | No | 0.39 | Inked | Good |
| H | 20% Nitric acid | No | 0.37 | Inked | Good |
| I | 10% Nitric acid | No | 0.44 | Inked | Good |
| J | No desmut | No | 0.49 | Inked | Good |

EXAMPLE 11

An electrochemically grained (with reduced sodium hydroxide desmut, compared to Example 12), anodized, polyvinyl phosphonic acid treated aluminum substrate with a reflection optical density of 0.36 was coated with the photosensitive layer formulation PS-2 using a #8 Meyer rod, followed by drying in an oven at 110° C. for 2 min.

| PS-2 | |
|---|---|
| Component | Weight (g) |
| Carboset 527 (Polymer with acid number of 80, from B. F. Goodrich) | 2.66 |
| Ebecryl 8301 | 4.94 |
| Renol Blue B2G-HW (Blue pigment dispersion from Clariant) | 0.47 |
| Pluronic L43 (Nonionic surfactant from BASF) | 0.11 |
| Titanocene compound (bis(η⁹-2,4-cyclopentadien-1-yl) bis[2,6-difluoro-3-(1H-pyrrol-1-yl)phenyl] titanium) | 1.01 |
| 2-Mercaptobenzoxazole | 0.40 |
| 4,4'-Bis(diethylamino)benzophenone | 0.40 |
| Acetone | 45.00 |
| Ethanol | 45.00 |

The photosensitive layer coated plate was further coated with a water-soluble overcoat OC-2 using a #8 Meyer rod, followed by hot air blow drying and baking in an oven at 110° C. for 2 min.

| OC-2 | |
|---|---|
| Component | Weight ratios |
| Airvol 203 (Polyvinyl alcohol from Air Products) | 15.0 |
| Triton X-100 (Surfactant from Union Carbide) | 0.20 |
| Water | 85.0 |

The above coated plate was exposed with violet laser imager equipped with a 60 mw laser diode emitting at about 405 nm (MAKO-2 from ECRM) at a dosage of 65 μJ/cm². The exposed plate was developed with an alkaline aqueous developer containing potassium silicate (about 2% by weight) and surfactants, rinsed with water, and then printed on an AB Dick 360 lithographic press for 2000 impressions. The plate gave good inking, clean background, and a resolution of 2-98%.

EXAMPLE 12

Comparative Example for Example 11

The plate is the same as that in Example 11 except that the substrate is an electrochemically grained, anodized, polyvinyl phosphonic acid treated aluminum substrate with a reflection optical density of 0.26 (prepared in the same manufacture line as in Example 11 except with typical sodium hydroxide desmut). The plate was tested the same as in Example 11. The plate gave clean background but poor inking and poor durability (20% dots lost).

EXAMPLE 13

An electrochemically grained (with nitric acid desmut), anodized, and polyvinyl phosphonic acid treated aluminum substrate with a reflection optical density of 0.43 was coated with the thermosensitive layer formulation PS-3 using a #8 Meyer rod, followed by drying in an oven at 90° C. for 2 min.

| PS-3 | |
|---|---|
| Component | Weight (g) |
| Neocryl B-728 (Polymer from Zeneca) | 2.76 |
| Ebecryl 8301 | 5.53 |
| Renol Blue B2G-HW (Blue pigment dispersion from Clariant) | 0.50 |
| Pluronic L43 (Nonionic surfactant from BASF) | 0.10 |
| (4-(2-Hydroxytetradecyl-oxy)phenyl)phenyliodonium hexafluorophosphate | 1.01 |
| PINA KF-1151 (Infrared dye from Allied Signal) | 0.10 |
| Methoxypropanol | 72.00 |
| 2-Butanone | 18.00 |

The thermosensitive layer coated plate was further coated with a water-soluble overcoat OC-2 using a #6 Meyer rod, followed by hot air blow drying and baking in an oven at 90° C. for 2 min.

The above coated plate was exposed with an infrared laser imager equipped with laser diodes emitting at about 830 nm (Trendsetter from Creo) at a dosage of 150 mJ/cm². The exposed plate was developed with a non-alkaline aqueous developer containing 6% by weight of benzyl alcohol and surfactants, rinsed with water, applied with a finisher (KPG 850S), and then printed on an AB Dick 360 lithographic press for 2000 impressions. The plate gave good inking, clean background, and a resolution of 2-98%.

EXAMPLE 14

Comparative Example for Example 13

The plate is the same as in Example 13 except that an electrochemically grained (with sodium hydroxide desmut), anodized, polyvinyl phosphonic acid treated aluminum substrate with a reflection optical density of 0.26 was used. The plate was imaged and developed the same as in Example 13. The imaged areas of the PS layer came off during the development.

EXAMPLE 15

An electrochemically grained (with nitric acid desmut), anodized, and silicate treated aluminum sheet with a reflection optical density of 0.34 was coated with thermosensitive layer formulation PS-4 using a #8 Meyer rod, followed by drying in an oven at 90° C. for 2 min.

PS-4

| Component | Weight ratios |
|---|---|
| Neocryl B-728 (Polymer from Zeneca) | 2.73 |
| Sartomer SR-399 (Acrylic monomer from Sartomer) | 6.52 |
| Pluronic L43 (Nonionic surfactant from BASF) | 0.56 |
| 2,4-Bis(trichloromethyl)-6-[(4-ethoxyethylenoxy)-phen-1-yl]-s-triazine | 1.00 |
| ADS-830AT (Infrared absorbing cyanine dye from American Dye Source) | 0.10 |
| Acetone | 90.0 |

The thermosensitive layer coated plate was further coated with a water-soluble overcoat OC-1 using a #6 Meyer rod, followed by drying in an oven at 90° C. for 2 min.

The plate was exposed with an infrared laser imager equipped with laser diodes emitting at about 830 nm (Trendsetter from Creo) at a dosage of 250 mJ/cm$^2$. The exposed plate was directly mounted on the plate cylinder of a lithographic press (Multigraphics 1250). After starting the press, the fountain roller was engaged for 20 rotations, the ink roller was engaged for 20 rotations, and the plate cylinder was then engaged with the blanket cylinder and printed with paper for 2000 impressions. The printed sheets showed good inking, clean background, and a resolution of 2-98%.

EXAMPLE 16

Comparative Example for Example 15

The plate is the same as in Example 15 except that an electrochemically grained (with sodium hydroxide desmut), anodized, silicate treated aluminum substrate with a reflection optical density of 0.25 was used. The plate was tested the same as in Example 15. The plate gave clean background but poor inking and poor durability (10% dots lost).

I claim:

1. A method of processing a lithographic printing plate comprising in order:
    (a) providing a lithographic printing plate comprising (i) an aluminum substrate; (ii) a photosensitive layer comprising a polymeric binder, a free radical polymerizable monomer, a free radical initiator, and a sensitizing dye; and (iii) a water soluble or dispersible overcoat; wherein said aluminum substrate is electrochemically grained, anodized, and further treated with a hydrophilic material, and has a reflection optical density of at least 0.30; said photosensitive layer is soluble or dispersible in ink and/or fountain solution and on-press developable with both ink and fountain solution; and said monomer has at least 3 (meth)acrylate groups, and the weight ratio of all the monomers having at least 3 (meth)acrylate groups to all the polymeric binders is larger than 1.0;
    (b) exposing said plate with a laser having a wavelength of from 200 to 1200 nm according to digital imaging information to cause hardening of the photosensitive layer in the exposed areas;
    (c) rinsing or applying said exposed plate with an aqueous solution to remove the water soluble or dispersible overcoat and to dampen without developing the plate; wherein said aqueous solution comprises a deactivating agent, and the rinse or application with said aqueous solution deactivates the photosensitive layer so that the non-hardened areas of said photosensitive layer become incapable of hardening under light during handling and on-press development; and
    (d) developing said exposed and deactivated plate with both ink and fountain solution on a lithographic press.

2. The method of claim 1 wherein said substrate has a reflection optical density of from 0.32 to 0.70.

3. The method of claim 1 wherein said substrate has a reflection optical density of from 0.34 to 0.60.

4. The method of claim 1 wherein said substrate has a reflection optical density of from 0.36 to 0.50.

5. The method of claim 1 wherein said substrate has an average surface roughness Ra of from 0.30 to 0.50 μm.

6. The method of claim 1 wherein said aluminum substrate is electrochemically grained with or without desmut treatment, anodized, and further treated with polyvinyl phosphonic acid aqueous solution.

7. The method of claim 1 wherein said aluminum substrate is electrochemically grained with or without desmut treatment, anodized, and further treated with a sodium silicate aqueous solution.

8. The method of claim 1 wherein said aluminum substrate is electrochemically grained with or without desmut treatment, anodized, and further treated with a phosphate fluoride aqueous solution.

9. The method of claim 1 wherein said sensitizing dye is a violet absorbing dye and said plate is exposed with a violet laser having a wavelength of from 390 to 430 nm at a dosage of less than 1000 μJ/cm$^2$.

10. The method of claim 1 wherein said sensitizing dye is an ultraviolet absorbing dye and said plate is exposed with an ultraviolet laser having a wavelength of from 300 to 390 nm at a dosage of less than 1000 μJ/cm$^2$.

11. The method of claim 1 wherein said sensitizing dye is an infrared absorbing dye and said laser is an infrared laser having a wavelength of from 750 to 1200 nm.

12. The method of claim 1 wherein said plate is exposed with a violet or ultraviolet laser having a wavelength of from 300 to 430 nm at a dosage of less than 1000 μm/cm$^2$.

13. The method of claim 1 wherein said laser is art infrared laser having a wavelength of from 750 to 1200 nm.

14. The method of claim 1 wherein said free radical initiator is a titanocene or hexaarylbiimidazole compound and said plate is exposed with a violet or ultraviolet laser having a wavelength of from 300 to 430 nm at a dosage of less than 300 µJ/cm$^2$.

15. The method of claim 1 wherein said free radical initiator is a hexaarylbiimidazole compound, said sensitizing dye is a dialkylaminobenzophenone compound, and said plate is exposed with a violet or ultraviolet laser having a wavelength of from 300 to 430 nm at a dosage of less than 300 µJ/cm$^2$.

16. The method of claim 1 wherein said monomer has at least 3 (meth)acrylate groups, and the weight ratio of all the monomers having at least 3 (meth)acrylate groups to all the polymeric binders is larger than 1.5.

17. The method of claim 1 wherein said plate is exposed with said laser on an exposure device off press and then mounted on press to develop with ink and/or fountain solution.

* * * * *